United States Patent
Hsu et al.

(10) Patent No.: US 10,528,787 B2
(45) Date of Patent: Jan. 7, 2020

(54) FINGERPRINT IDENTIFYING MODULE

(71) Applicant: Primax Electronics Ltd., Taipei (TW)

(72) Inventors: Mao-Hsiu Hsu, Taipei (TW); Kuan-Pao Ting, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 308 days.

(21) Appl. No.: 15/629,148

(22) Filed: Jun. 21, 2017

(65) Prior Publication Data

US 2018/0211091 A1 Jul. 26, 2018

(30) Foreign Application Priority Data

Jan. 25, 2017 (TW) .............................. 106102952 A

(51) Int. Cl.
*G06K 9/24* (2006.01)
*G06K 9/00* (2006.01)
*H05K 5/06* (2006.01)

(52) U.S. Cl.
CPC ........... *G06K 9/00053* (2013.01); *H05K 5/06* (2013.01)

(58) Field of Classification Search
CPC ..................... G06K 9/00–82; H05K 5/00–069
See application file for complete search history.

(56) References Cited

U.S. PATENT DOCUMENTS

| | | | | |
|---|---|---|---|---|
| 5,657,203 A | * | 8/1997 | Hirao | H01L 21/4842 257/E23.066 |
| 2010/0279694 A1 | * | 11/2010 | Yagi | H04M 1/0266 455/436 |
| 2011/0050403 A1 | * | 3/2011 | Liu | A61B 6/4405 340/384.1 |
| 2012/0015530 A1 | * | 1/2012 | Tatsukami | G06F 1/1616 439/64 |
| 2014/0021863 A1 | * | 1/2014 | Bertrand | H01L 23/057 315/129 |
| 2017/0147849 A1 | * | 5/2017 | Tseng | G06K 9/00053 |
| 2017/0213068 A1 | * | 7/2017 | Chang | G06K 9/00053 |
| 2017/0243045 A1 | * | 8/2017 | Chang | G06K 9/0002 |
| 2017/0243046 A1 | * | 8/2017 | Chang | G06K 9/0053 |
| 2018/0053037 A1 | * | 2/2018 | Zhang | A61B 5/117 |
| 2018/0165499 A1 | * | 6/2018 | Hsu | G06K 9/00053 |
| 2018/0174013 A1 | * | 6/2018 | Lee | G06K 19/07707 |
| 2018/0211091 A1 | * | 7/2018 | Hsu | H05K 5/06 |
| 2019/0072903 A1 | * | 3/2019 | Park | G04B 37/08 |

FOREIGN PATENT DOCUMENTS

CN 105825165 A * 8/2016

\* cited by examiner

*Primary Examiner* — Sean T Motsinger
(74) *Attorney, Agent, or Firm* — Muncy, Geissler, Olds & Lowe, P.C.

(57) ABSTRACT

The present invention relates to a fingerprint identifying module, including a circuit board, a fingerprint sensing component, a cover plate, and a waterproof sleeve. The fingerprint sensing component is disposed on the circuit board, and the cover plate covers the fingerprint sensing component. The waterproof sleeve partially covers the cover plate and the circuit board, so as to prevent a foreign liquid from entering a space between the fingerprint sensing component and the circuit board. The cover plate includes a cover plate body and an extending portion. The cover plate body covers the fingerprint sensing component. The extending portion surrounds the cover plate body, is located between the waterproof sleeve and the fingerprint sensing component, and may block the foreign liquid from passing.

9 Claims, 4 Drawing Sheets

FINGERPRINT IDENTIFYING MODULE

FIELD OF THE INVENTION

The present invention relates to an identity identifying component, and in particular, to a fingerprint identifying module for identifying a user identity by using a fingerprint.

BACKGROUND OF THE INVENTION

In recent years, a fingerprint identifying technology is applied to various electronic products, so that a user may input his/her fingerprint to an electronic apparatus and instruct the electronic apparatus to store the fingerprint, and subsequently, the user may input his/her fingerprint by using a fingerprint identifying module to unlock the electronic apparatus. Using the fingerprint identifying technology to unlock the electronic apparatus is faster and more convenient than the conventional unlocking manner of manually inputting a password. Therefore, the fingerprint identifying technology is favored by users, and demands for the fingerprint identifying module also greatly increase.

A structure of a conventional fingerprint identifying module is described below. Referring to FIG. 1, FIG. 1 is a schematic structural breakdown diagram of a conventional fingerprint identifying module. A conventional fingerprint identifying module 1 includes a fingerprint sensing component 10, a coating layer 11, a circuit board 12, and a support plate 13. The fingerprint sensing component 10 is disposed on the circuit board 12 and is electrically connected to the circuit board 12 so as to obtain electric power. A function of the fingerprint sensing component 10 is sensing a finger of a user to capture fingerprint information of the user. The coating layer 11 is disposed on an upper surface of the fingerprint sensing component 10 by using a coating technology. In addition to protecting the fingerprint sensing component, a function of the coating layer 11 is providing a color matching the electronic apparatus or a required particular color. The support plate 13 of the fingerprint sensing component bears the foregoing components and is in contact with the circuit board 12, so as to enhance structural strength of the circuit board 12 and prevent the circuit board 12 from being damaged by an external force.

Referring to FIG. 2, FIG. 2 is a sectional view of a partial structure of a conventional fingerprint identifying module placed in an electronic product. After the conventional fingerprint identifying module 1 is assembled, the conventional fingerprint identifying module 1 needs to be disposed in an accommodation space 21 of an electronic apparatus 2. In addition, a part of the conventional fingerprint identifying module 1 needs to be exposed outside a glass panel 22 of the electronic apparatus 2 for contact of a finger. However, there is a gap between the accommodation space 21 and the conventional fingerprint identifying module 1. Therefore, a case in which a foreign liquid (for example various drinks such as tea or water) flows into the gap may easily occur. When the foreign liquid flows to a circuit of the circuit board 12 of the conventional fingerprint identifying module, a short-circuit phenomenon may occur on the circuit. Therefore, the conventional fingerprint identifying module 1 may have a fault and cannot operate.

Therefore, a fingerprint identifying module with a waterproof function is needed.

SUMMARY OF THE INVENTION

An objective of the present invention is to provide a fingerprint identifying module with a waterproof function.

In a preferred embodiment, the present invention provides a fingerprint identifying module, including a circuit board, a fingerprint sensing component, a cover plate, and a waterproof sleeve. The fingerprint sensing component is disposed on the circuit board and is used to detect a fingerprint image of a finger. The cover plate covers the fingerprint sensing component, and the waterproof sleeve partially covers the cover plate and the circuit board, and is used to prevent a foreign liquid from entering a space between the fingerprint sensing component and the circuit board. The cover plate includes a cover plate body and an extending portion. The cover plate body covers the fingerprint sensing component, and the extending portion is formed by extending the cover plate body outward and surrounds the cover plate body. The extending portion is located between the waterproof sleeve and the fingerprint sensing component and may block the foreign liquid from passing.

In a preferred embodiment, the waterproof sleeve includes a main body, a first isolation wall, and a second isolation wall. The first isolation wall is disposed on an upper edge of the main body, and the first isolation wall corresponds to the extending portion. The first isolation wall covers the extending portion by respectively getting in contact with an upper surface of the extending portion and a side wall of the cover plate body. The second isolation wall is disposed on a lower edge of the main body, and the second isolation wall partially covers the circuit board by getting in contact with a part of a lower surface of the circuit board.

Briefly, a cover plate of a fingerprint identifying module of the present invention has an extending portion extending outward. When a waterproof sleeve covers the cover plate, a fingerprint sensing component, and a circuit board, the extending portion is located between the waterproof sleeve and the fingerprint sensing component, so as to further block a foreign liquid from entering the fingerprint identifying module. In addition, the waterproof sleeve includes a first isolation wall disposed on an upper edge of the waterproof sleeve. A shape of the first isolation wall corresponds to the cover plate, which thus helps assembly of the waterproof sleeve and may provide a relatively high sealing degree.

DETAILED DESCRIPTION OF THE PREFERRED EMBODIMENT

Figure 1:
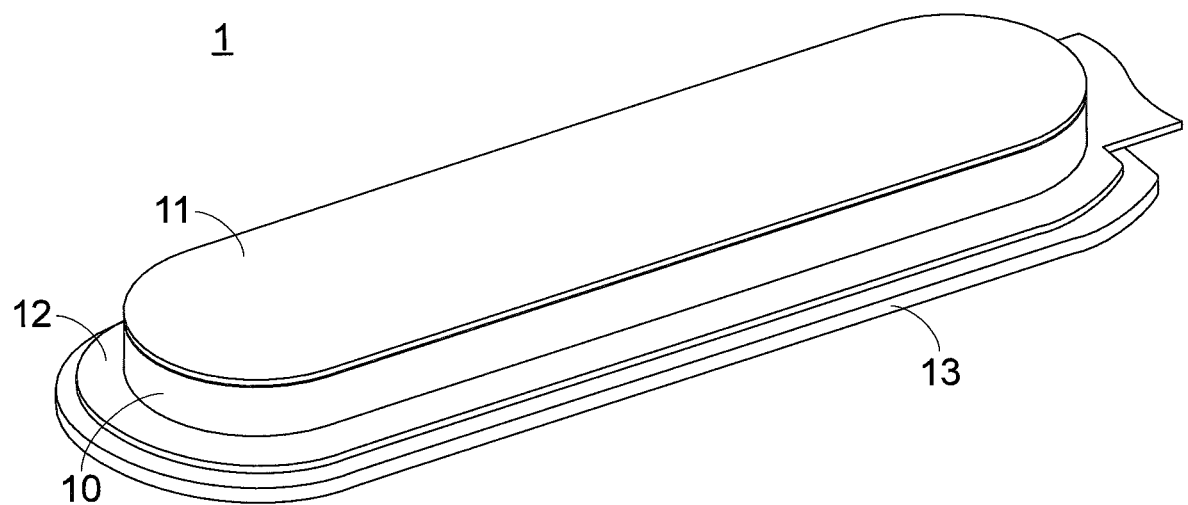
FIG. 1 is a schematic structural breakdown diagram of a conventional fingerprint identifying module.
Figure 2:
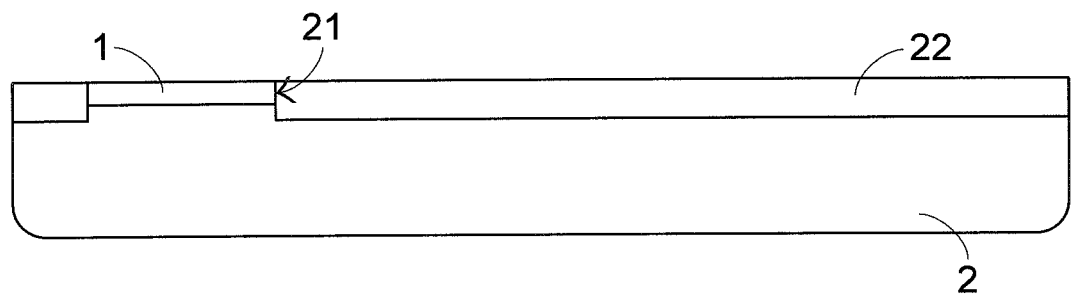
FIG. 2 is a sectional view of a partial structure of a conventional fingerprint identifying module placed in an electronic product.
Figure 3:
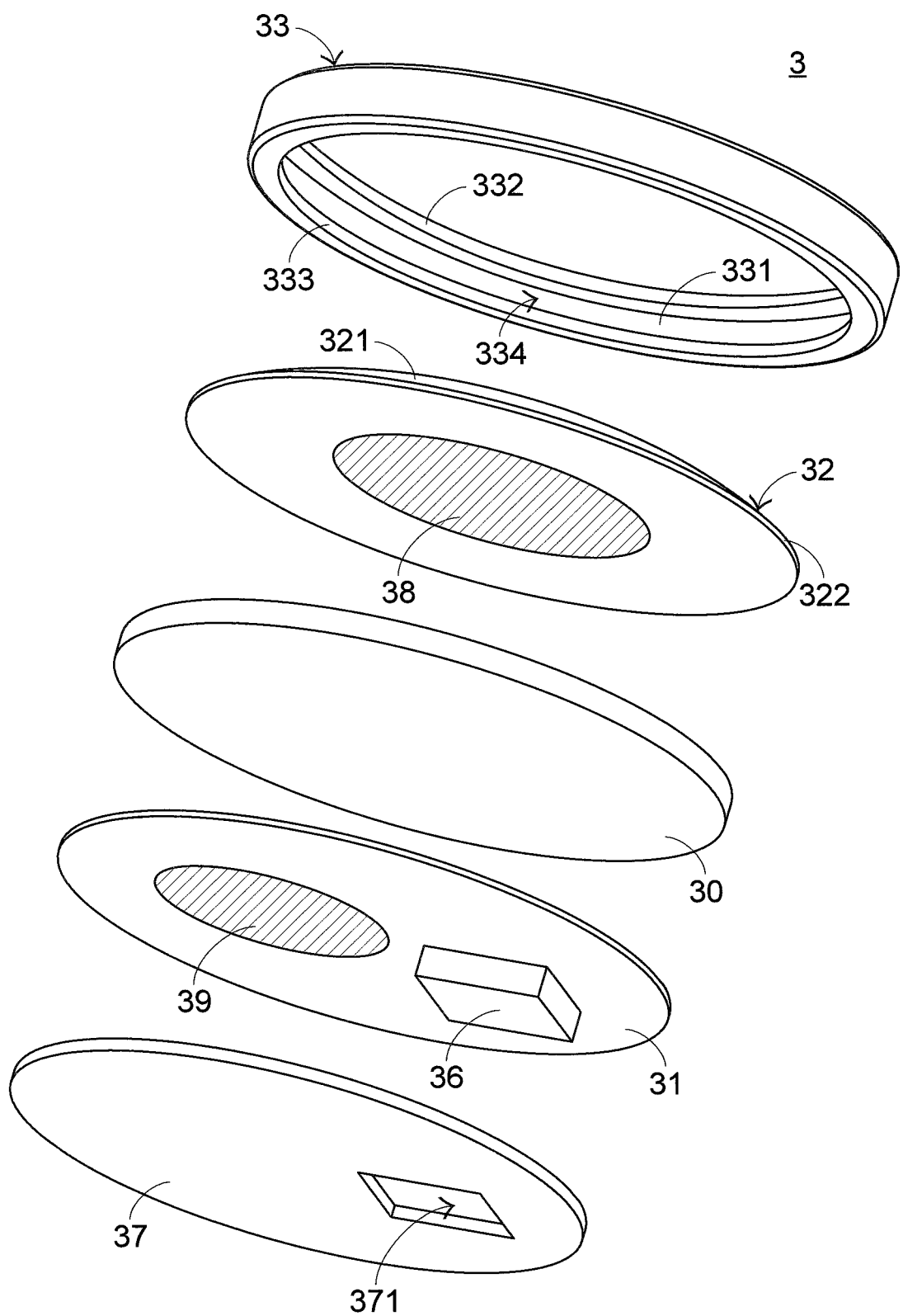
FIG. 3 is a schematic structural breakdown diagram of a conventional fingerprint identifying module according to a preferred embodiment of the present invention.
Figure 4:
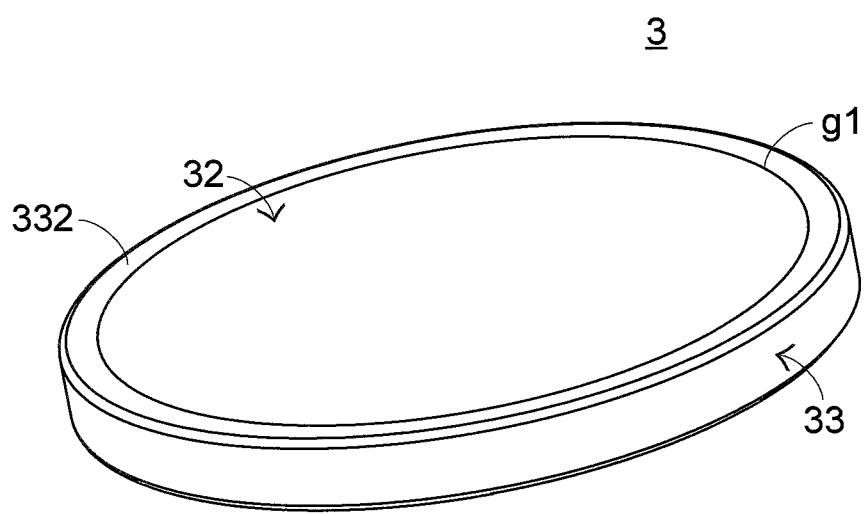
FIG. 4 is a schematic structural diagram of a conventional fingerprint identifying module according to a preferred embodiment of the present invention.

The present invention provides a fingerprint identifying module that can resolve a conventional technical problem. Please refer to FIG. 3 and FIG. 4 synchronously. FIG. 3 is a schematic structural breakdown diagram of a conventional fingerprint identifying module according to a preferred embodiment of the present invention, and FIG. 4 is a schematic structural diagram of a conventional fingerprint identifying module according to a preferred embodiment of the present invention. A fingerprint identifying module 2 may be disposed in an electronic apparatus (not shown in the figure), and includes a fingerprint sensing component 30, a circuit board 31, a cover plate 32, a waterproof sleeve 33, a first adhesive 34, a second adhesive 35, a connector 36, a support plate 37, a third adhesive 38, and a fourth adhesive 39. The fingerprint sensing component 30 is disposed on the circuit board 31, and a function of the fingerprint sensing component 30 is detecting a fingerprint image of a finger (not shown in the figure) of a user. The cover plate 32 covers the fingerprint sensing component 30, and the cover plate 32 includes a cover plate body 321 and an extending portion 322. The cover plate body 321 covers the fingerprint sensing component 30, and the extending portion 322 is formed by extending the cover plate body 321 outward and surrounds the cover plate body 321. The waterproof sleeve 33 partially covers the cover plate 32 and the circuit board 31. A function of the waterproof sleeve 33 is preventing a foreign liquid from entering a space between the fingerprint sensing component 30 and the circuit board 31, that is, providing a waterproof function. The fingerprint sensing component 30 is combined with the circuit board 31 by using a surface mount technology (SMT). In this preferred embodiment, the fingerprint sensing component 30 is packaged in a land grid array (Land Grid Array, LGA) manner or a ball grid array (Ball Grid Array, BGA) manner.

The circuit board 31 is electrically connected to the fingerprint sensing component 30, and is in contact with the support plate 37. The support plate 37 is located below the circuit board 31 and is connected to the circuit board 31. The support plate 37 may bear the circuit board 31 thereon and strengthen a structure of the circuit board 31. Combination of the components is performed by using the third adhesive 38 and the fourth adhesive 39. The third adhesive 38 is disposed on a lower surface of the cover plate 32 or an upper surface of the fingerprint sensing component 30, and may combine the cover plate 32 and the fingerprint sensing component 30. The fourth adhesive 39 is disposed on a lower surface of the circuit board 31 or on an upper surface of the support plate 37, and may combine the circuit board 31 and the support plate 37. In this preferred embodiment, a flexible printed circuit board (FPC) or a rigid-flex printed circuit board may be selected as the circuit board 31. A non-liquid double-sided adhesive tape or a liquid adhesive may be selected as the third adhesive 38 and the fourth adhesive 39. It should be particularly noted that the third adhesive may be an anisotropic conductive adhesive (ACF) according to actual requirements, so as to improve electrical conduction between the fingerprint sensing component and the circuit board. Similarly, the fourth adhesive may be a conductive adhesive according to actual requirements, so as to improve electrical conduction between the circuit board and the support plate.

In addition, the support plate 37 is provided with a hole 371, and the hole 371 corresponds to the connector 36. By means of setting of the hole 371, the connector 36 can be disposed on a lower surface of the circuit board 31 by passing through the support plate 37, and the connector may be electrically connected to the circuit board 31 and an external electronic component (not shown in the figure). The external electronic component is, for example, a connection portion of an electronic apparatus for accommodating the fingerprint identifying module 3, so that an electrical connection is established between the fingerprint identifying module 3 and the electronic apparatus.

In this preferred embodiment, the cover plate 32 is made of a glass material, which is merely used for illustration instead of limitation. In another preferred embodiment, the cover plate may be also made of a ceramic material. In a preferred practice, the cover plate further includes an anti-fingerprint layer and a color layer. The anti-fingerprint layer is disposed on an upper surface of the cover plate, and may prevent a fingerprint texture of a finger from attaching to the cover plate so as to keep clean. On the other hand, because the fingerprint texture cannot easily reside on the anti-fingerprint layer, the fingerprint sensing component can correctly detect a fingerprint image of a finger without being affected by the residual fingerprint texture. The color layer is disposed on a lower surface of the cover plate, so that the cover plate may display a required color to produce a beautiful effect.

Figure 5:
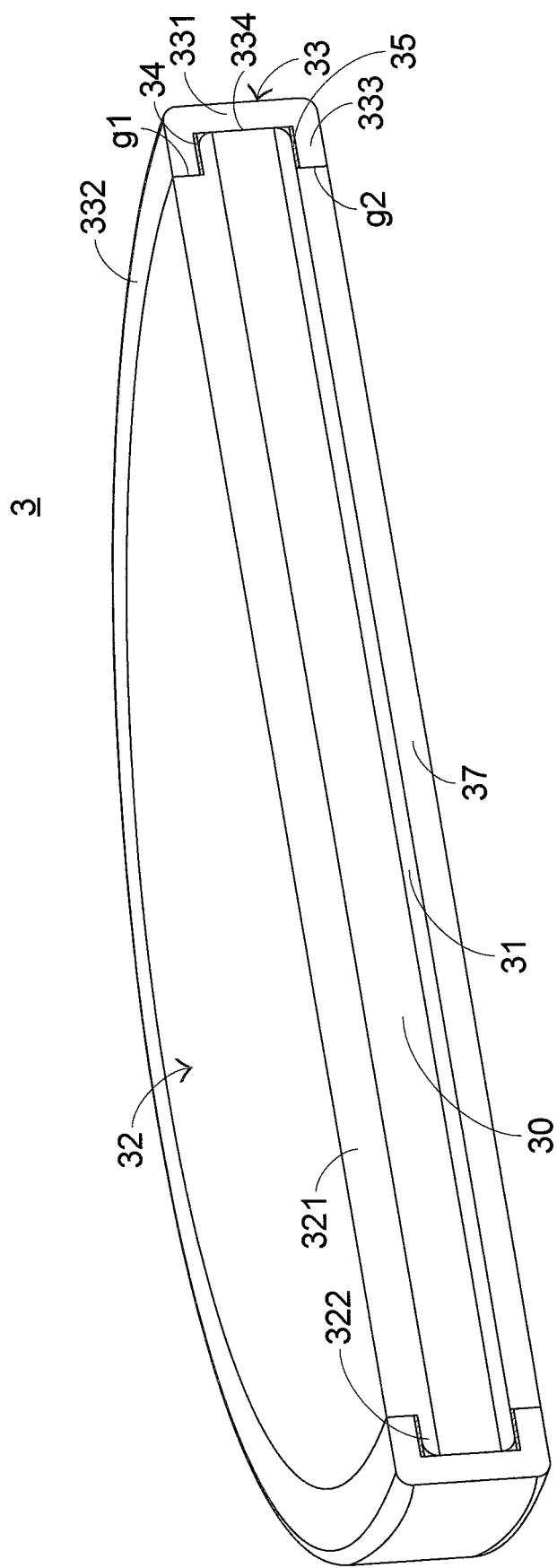
FIG. 5 is a sectional view of a structure of a conventional fingerprint identifying module according to a preferred embodiment of the present invention.

A structure of the waterproof sleeve 33 is described below in detail. Refer to FIG. 3, FIG. 4, and FIG. 5 at the same time. FIG. 5 is a sectional view of a structure of a conventional fingerprint identifying module according to a preferred embodiment of the present invention. The waterproof sleeve 33 includes a main body 331, a first isolation wall 332, and a second isolation wall 333. The first isolation wall 332 is disposed on an upper edge of the main body 331, and the first isolation wall 331 corresponds to an extending portion 322 of the cover plate 32. The first isolation wall 332 covers the extending portion 322 by respectively getting in contact with an upper surface of the extending portion 322 and a side wall of the cover plate body 321. The second isolation wall 333 is disposed on a lower edge of the main body 331, and the second isolation wall 333 partially covers the circuit board 31 by getting in contact with a part of a lower surface of the circuit board 31. An accommodation space 334 formed between the first isolation wall 332 and the second isolation wall 333 may accommodate a part of the cover plate 32, the fingerprint sensing component 30, and the circuit board 31. The extending portion 322 is located between the waterproof sleeve 33 and the fingerprint sensing component 30, and may block a foreign liquid from passing.

In addition, a shape of the first isolation wall 332 is complementary to a shape of the extending portion 322 and a shape of the side wall of the cover plate body 321, which thus helps assembly of the waterproof sleeve 33. After the waterproof sleeve 33 covers the cover plate 32, the fingerprint sensing component 30, and the circuit board 31, the fingerprint identifying module of the present invention may form a flat surface, which is not only beautiful, but also improves a sealing degree of the waterproof sleeve 33 and the cover plate 32, that is, improves a waterproof effect of the fingerprint identifying module.

In a preferred practice, in the present invention, the first adhesive 34 may be disposed on an inner surface of the first isolation wall 332. When the waterproof sleeve 33 partially covers the cover plate 32, the first adhesive 34 may bond the first isolation wall 332 and the extending portion 322, and may fill a first gap g1 between the cover plate 32 and the fingerprint sensing component 30, so as to further block a foreign liquid from entering the first gap g1. Similarly, in the present invention, the second adhesive 35 may be disposed on an inner surface of the second isolation wall 333. When the waterproof sleeve 33 partially covers the circuit board 31, the second adhesive 35 may bond the second isolation wall 333 and a part of a lower surface of the circuit board 31, and may fill a second gap g2 between the circuit board 31 and the waterproof sleeve 33, so as to further block a foreign liquid from entering the second gap g2. It should be particularly noted that in the fingerprint identifying module of the present invention, it is not limited that the first adhesive and the second adhesive need to be disposed on the inner surface of the waterproof sleeve, and this is merely an optimal practice. Actually, the extending portion located between the waterproof sleeve and the fingerprint sensing component is sufficient for blocking a foreign liquid and preventing the foreign liquid from entering an internal circuit.

It can be known from the above that a cover plate of a fingerprint identifying module of the present invention is provided with an extending portion extending outward. When a waterproof sleeve covers the cover plate, a fingerprint sensing component, and a circuit board, the extending portion is located between the waterproof sleeve and the fingerprint sensing component, so as to further block a foreign liquid from entering the fingerprint identifying module. In addition, the waterproof sleeve includes a first isolation wall disposed on an upper edge of the waterproof sleeve. A shape of the first isolation wall corresponds to the cover plate, which thus helps assembly of the waterproof sleeve and may provide a relatively high sealing degree.

The foregoing descriptions are merely preferred embodiments of the present invention, but are not intended to limit the patent scope of the present invention. Therefore, any equivalent variation or modification made without departing from the spirit of the present invention should fall within the patent scope of the present invention.

What is claimed is:

1. A fingerprint identifying module, disposed in an electronic apparatus, wherein the fingerprint identifying module comprises:
   a circuit board;
   a fingerprint sensing component, disposed on the circuit board, used to detect a fingerprint image of a finger;
   a cover plate, covering the fingerprint sensing component; and
   a waterproof sleeve, partially covering the cover plate and the circuit board, used to prevent a foreign liquid from entering a space between the fingerprint sensing component and the circuit board, wherein the cover plate comprises:
   a cover plate body, covering the fingerprint sensing component; and
   an extending portion that is formed by extending the cover plate body outward and surrounds the cover plate body, wherein the extending portion is located between the waterproof sleeve and the fingerprint sensing component and may block the foreign liquid from passing;
   wherein the waterproof sleeve comprises:
   a main body;
   a first isolation wall, disposed on an upper edge of the main body, wherein the first isolation wall corresponds to the extending portion, and the first isolation wall covers the extending portion by respectively getting in contact with an upper surface of the extending portion and a side wall of the cover plate body; and
   a second isolation wall, disposed on a lower edge of the main body, wherein the second isolation wall partially covers the circuit board by getting in contact with a part of a lower surface of the circuit board.

2. The fingerprint identifying module according to claim 1, wherein an accommodation space formed between the first isolation wall and the second isolation wall may accommodate a part of the cover plate, the fingerprint sensing component, and the circuit board.

3. The fingerprint identifying module according to claim 1, further comprising a first adhesive, disposed on an inner surface of the first isolation wall, used to bond the first isolation wall and the extending portion when the waterproof sleeve partially covers the cover plate, wherein a first gap between the cover plate and the fingerprint sensing component may be filled.

4. The fingerprint identifying module according to claim 1, further comprising a second adhesive, disposed on an inner surface of the second isolation wall, used to bond the second isolation wall and the part of the lower surface of the circuit board when the waterproof sleeve partially covers the circuit board, wherein a second gap between the circuit board and the waterproof sleeve may be filled.

5. The fingerprint identifying module according to claim 1, further comprising a third adhesive, disposed on the cover plate or the fingerprint sensing component, used to combine the cover plate and the fingerprint sensing component.

6. The fingerprint identifying module according to claim 1, further comprising:
   a connector, disposed on the circuit board, used to electrically connect the circuit board and a foreign electronic component; and
   a support plate, disposed on the circuit board, used to strengthen a structure of the circuit board.

7. The fingerprint identifying module according to claim 6, wherein the support plate comprises a hole, and the hole corresponds to the connector, so that the connector is disposed on the circuit board by passing through the hole.

8. The fingerprint identifying module according to claim 6, further comprising a fourth adhesive, disposed on the circuit board or the support plate, used to combine the circuit board and the support plate.

9. The fingerprint identifying module according to claim 8, wherein the fourth adhesive is a conductive adhesive.

* * * * *